United States Patent
Tocher et al.

(10) Patent No.: US 10,929,575 B2
(45) Date of Patent: Feb. 23, 2021

(54) MODELLING SYSTEM AND METHOD

(71) Applicant: NCTech Ltd, Edinburgh (GB)

(72) Inventors: Neil Tocher, Edinburgh (GB);
Cameron Ure, Edinburgh (GB);
Mansour Ahmadian, Edinburgh (GB)

(73) Assignee: NCTech Ltd, Edinburgh (GB)

( * ) Notice: Subject to any disclaimer, the term of this patent is extended or adjusted under 35 U.S.C. 154(b) by 411 days.

(21) Appl. No.: 15/683,519

(22) Filed: Aug. 22, 2017

(65) Prior Publication Data

US 2018/0060465 A1 Mar. 1, 2018

(30) Foreign Application Priority Data

Aug. 26, 2016 (GB) .................................... 1614580

(51) Int. Cl.
*G06F 30/13* (2020.01)
*G06F 30/20* (2020.01)
(Continued)

(52) U.S. Cl.
CPC .............. *G06F 30/20* (2020.01); *G06F 30/13* (2020.01); *G06T 17/00* (2013.01); *G01C 1/04* (2013.01);
(Continued)

(58) Field of Classification Search
None
See application file for complete search history.

(56) References Cited

U.S. PATENT DOCUMENTS

2008/0112610 A1* 5/2008 Israelsen ................ G06T 17/00
  382/154
2010/0020074 A1* 1/2010 Taborowski ............ G06T 7/70
  345/420

(Continued)

FOREIGN PATENT DOCUMENTS

| GB | 2538751 A | 11/2016 |
|---|---|---|
| WO | WO 2009/089126 A1 | 7/2009 |
| WO | WO 2013/050576 A2 | 4/2013 |

OTHER PUBLICATIONS

European Patent Office, Extended European Search Report for Application No. 17187829.1, dated Oct. 30, 2017, 7 pages, Germany.

(Continued)

*Primary Examiner* — Kibrom K Gebresilassie
(74) *Attorney, Agent, or Firm* — Alston & Bird LLP

(57) ABSTRACT

A method is provided for generating or updating a virtual 3D model of a structure or environment using a modelling system. The modelling system includes at least one imaging system, at least one processor and data storage. The method involves transferring a part but not all of a model of a structure or environment from an external data store to the data storage of the modelling system; using the at least one imaging system to collect at least one image of the structure or environment; determining or collecting depth information for the structure or environment; and updating the part of the model in the data storage with the at least one image and the depth information to form an updated part of the model. Also described: corresponding modelling system, processing system, computer program product and drone system.

22 Claims, 5 Drawing Sheets

(51) Int. Cl.
    *G06T 17/00* (2006.01)
    *G01C 1/04* (2006.01)
    *G06T 7/73* (2017.01)

(52) U.S. Cl.
    CPC ...... *G06T 7/75* (2017.01); *G06T 2207/10028* (2013.01); *G06T 2207/30244* (2013.01); *G06T 2219/2004* (2013.01); *G06T 2219/2016* (2013.01)

(56) References Cited

U.S. PATENT DOCUMENTS

| | | | | |
|---|---|---|---|---|
| 2010/0045774 | A1* | 2/2010 | Len | H04N 5/2259 348/36 |
| 2010/0302239 | A1* | 12/2010 | Tokita | A63F 13/06 345/419 |
| 2012/0014456 | A1* | 1/2012 | Martinez Bauza | H04N 19/597 375/240.25 |
| 2012/0019522 | A1* | 1/2012 | Lawrence | F41G 3/02 345/419 |
| 2012/0059720 | A1* | 3/2012 | Musabji | G06T 17/05 705/14.58 |
| 2013/0004060 | A1* | 1/2013 | Bell | G01S 17/89 382/154 |
| 2013/0006525 | A1* | 1/2013 | Stroila | G01C 21/20 701/434 |
| 2013/0096873 | A1* | 4/2013 | Rosengaus | G01C 15/002 702/151 |
| 2013/0169681 | A1* | 7/2013 | Rasane | G06Q 50/10 345/633 |
| 2014/0043436 | A1* | 2/2014 | Bell | G06T 19/20 348/46 |
| 2014/0125768 | A1* | 5/2014 | Bell | H04N 13/106 348/46 |
| 2014/0125776 | A1* | 5/2014 | Damaskinos | G02B 21/365 348/50 |
| 2014/0257595 | A1* | 9/2014 | Tillmann | G05D 1/0022 701/2 |
| 2015/0262421 | A1* | 9/2015 | Bell | G06T 17/20 345/423 |
| 2015/0310669 | A1* | 10/2015 | Kamat | G06T 19/006 345/633 |
| 2015/0332505 | A1* | 11/2015 | Wang | G06T 15/06 345/633 |
| 2015/0350618 | A1* | 12/2015 | Meier | H04N 9/3185 345/7 |
| 2016/0146604 | A1* | 5/2016 | Metzler | G01C 15/002 33/228 |
| 2017/0148250 | A1* | 5/2017 | Angermayer | G06T 17/20 |
| 2018/0082435 | A1* | 3/2018 | Whelan | G06T 7/579 |
| 2018/0143023 | A1* | 5/2018 | Bjorke | G01C 21/206 |
| 2019/0205484 | A1* | 7/2019 | Morkos | G06Q 10/06315 |
| 2019/0287297 | A1* | 9/2019 | Abhiram | G06T 7/246 |
| 2019/0347783 | A1* | 11/2019 | Salgian | G02B 27/017 |

OTHER PUBLICATIONS

Intellectual Property Office, Search Report for Application No. GB1614580.7, dated Feb. 20, 2017, 1 page, United Kingdom.

Whelan, Thomas, et al, "Kintinuous: Spatially extended KinectFusion", RSS Workshop on RGB-D: Advanced Reasoning With Depth Cameras, Jul. 2012, 8 pages, Sydney, Australia.

* cited by examiner

MODELLING SYSTEM AND METHOD

CROSS-REFERENCE TO RELATED APPLICATIONS

This application claims priority to and the benefit of United Kingdom Application No. 1614580.7, filed Aug. 26, 2016, the contents of which as are hereby incorporated by reference in their entirety.

BACKGROUND

Technical Field

The present disclosure relates generally to modelling system, and particularly but not exclusively to a building information modelling (BIM) system, and associated method.

Related Art

Modelling systems, such as building information modelling (BIM) systems, collect both depth data and visual images and use these to construct 3D virtual models of the environment surrounding the modelling system. One type of modelling system comprises a laser scanner in conjunction with one or preferably more cameras. The laser scanner is operable to collect the depth information for the surrounding environment, whilst the one or more cameras collect visual images of the surrounding environment. A processing system is then operable to combine the depth information and the visual images into a 3D virtual model.

Such systems are particularly useful in the imaging of buildings for a variety of purposes. For example, during construction, it is possible to collect 3D images of the partly constructed building at various stages of construction in order to keep customers, architects, site managers and other interested parties apprised of the progress of the building works.

However, there are a number of challenges that face BIM and other modelling systems. For example, models formed of both depth and image data can be very large, which makes it difficult to use such systems online or as part of a wireless or distributed network. In addition, it places a great burden on both the network and data storage capabilities of the systems.

Furthermore, there are challenges in getting all of the information stitched in register, i.e. such that each piece of depth data and each image is located in the correct position in the 3D virtual model. This often requires the system to be securely fixed on a tripod or other suitable mounting arrangement. In addition, "blind spots" in the model data relating to areas of the surrounding environment obscured behind obstacles that cannot be imaged by the modelling system may be a problem. However, if the system is moved and used to collect additional data, then this may result in issues in stitching together the depth and image data collected with the system located in two different locations.

It is an object of at least one example of the present disclosure to overcome or mitigate at least one problem with the prior art. It is at least one object of the present disclosure to provide an improved modelling system and method.

BRIEF SUMMARY

According to a first aspect of the present invention there is provided a method for generating or updating a virtual 3D model of a structure or environment using a modelling system, the modelling system comprising at least one imaging system, means for determining depth information such as at least one depth information collection system, at least one processor and data storage, the method comprising: transferring a part but not all of a model of a structure or environment from an external data store to the data storage of the modelling system; using the at least one imaging system to collect at least one image of the structure or environment; using the at least one depth information collection system to collect depth information of the structure or environment; updating the part of the model in the data storage with the at least one image and the depth information to form an updated part of the model; and transferring the updated part of the model from the data storage of the modelling system to the external data store.

The model may be or comprise a virtual or pseudo 3D model.

The method may comprise modifying the model stored by the external data store with the updated part of the model received from the data storage of the modelling system. For example, the method may comprise replacing at least some or all of the previous part of the model stored in the data store with at least some or all of the updated part of the model. The method may comprise replacing only those portions of the model that have changed with the corresponding portions of the updated model, wherein the corresponding portions of the updated model may represent portions of the updated part of the model that differ from the corresponding parts of the previous model stored in the data store.

The imaging system may be or comprise a digital camera or imaging sensor, such as a CMOS, CCD or other suitable imaging sensor.

The depth information collection system may be configured to collect depth information, which may be representative of 3D positions of objects, structures and/or surfaces in the environment around the modelling system and/or distances from the modelling system to objects, structures and/or surfaces in the environment around the modelling system. The depth information collection system may comprise a scanner for collecting at least some of the depth information, preferably a laser scanner, but optionally an infra-red or other electromagnetic radiation based scanner, a magnetic, electrical or electromagnetic field scanner and/or the like. The depth information system may be configured to derive at least part of the depth information from stereo-photogrammetry from a plurality of at least partially overlapping images.

The external data store may be comprised in a server system, network attached storage (NAS) system, a personal or enterprise level computer, and/or the like. The modelling system may be configured to connect to the external data store via a wired or wireless connection.

With the system of the present disclosure, the bandwidth required by the wired or wireless connection may be greatly reduced. Furthermore, the amount of data storage required by the modelling system may be significantly reduced and/or more modelling data may be stored. In addition, the usable duration between syncing the modelling device to the external data storage may be increased. The processing resource required by the processor of the modelling system to perform the modelling process and/or to carry out actions in relation to the model may be reduced. Typically, only a part of a structure or environment may be imaged in a given session. As such, any reduction in usability of the system may be minimal.

The method may comprise transmitting only changes between the part of the model previously or most recently transferred from the external data store to the data storage on the modelling system and the updated part of the model. By transferring only the changes in the part of the model, the bandwidth and time for transferring the newly collected data from the modelling system to the external data store can be greatly reduced.

The method may comprise matching at least part of the depth information collected by the at least one depth information collection system and/or at least part of one or more of the images collected by the at least one imaging system to the model, e.g. by using pattern matching, pixel matching, key-point matching and/or the like. The method may comprise using the matched depth information and/or images to identify the location of the modelling system relative to the part of the structure or environment associated with or represented by the part of the model comprised in the data storage. The method comprise using the location of the modelling system relative to the part of the structure or environment associated with or represented by the part of the model comprised in the data storage and/or the relative position or arrangement of matched and unmatched depth information in order to position the unmatched parts of the depth information and/or the unmatched parts of the images in the model. In this way, the stitching of the newly collected depth information and images with the existing model can be improved.

The modelling system may be operable in a plurality of modes. For example, the modelling system may be operable in mounted and roaming modes. In the mounted mode, the modelling system may be mounted on a tripod, stand or other mount. In the mounted and/or rotation mode, the modelling system may be configured to collect images and/or spatial data whilst at least one or all of the sensor systems are being rotated and/or between rotations of the at least one or all of the sensor systems, e.g. around a rotation axis, and/or at one or more different rotational positions around a rotation axis. In the roaming mode, the modelling system may be freely movable, de-mounted, hand held and/or detached from the stand, tripod or other support. This may allow obscured areas to be more easily imaged and added to the model. The modelling system may be operable in a drone or vehicle mounted mode. In the drone or vehicle mounted mode, the modelling system may be mounted to a drone or other automated transport system or a vehicle. By collecting images whilst the modelling system is mounted to a drone, and incorporating these in the model, improved imaging of areas that may otherwise be obscured or incompletely imaged may be achieved. The matching of the collected depth information and/or images with the part of the 3D or virtual 3D model may permit the roaming mode and/or the drone or vehicle mounted mode whilst still allowing the collected depth information and/or images to be accurately stitched into the model to form the updated model.

The method may comprise stitching a plurality of the images and/or depth information together to form a unified image and/or unified depth information and/or at least a portion of the model, which may be used to update the part of the model stored in the data storage of the modelling system. The method may comprise stitching the images together at least in part by using the depth information, e.g. to guide the image stitching. For example the method may comprise using the depth information to determine if objects in a plurality of images are at the same or different spatial positions, or if objects shown in a plurality of images are the same or different objects, and stitch the images together accordingly. Optionally, the method may comprise stitching the images together, e.g. based on image matching, pixel matching, keypoint matching and/or the like, and subsequently refining the stitching based on the depth information and/or wrapping the images around the depth information.

The modelling system may comprise a mount. The mount may be mountable or mounted to, or configured to receive, the stand, tripod or other support for supporting the modelling system. The mount may be or comprise a rotatable mount. The mount may be adapted to produce relative rotation of the mount and at least part or all of the rest of the modelling system, e.g. when in the mounted mode. The modelling system may be configured such that at least part of the modelling system (such as a part of the modelling system comprising at least one or each of the sensor systems) rotates or spins, for example relative to the mount and/or the tripod or stand or other support, e.g. when in the mounted mode. The modelling system may comprise a motor, such as a stepper motor, for rotating the modelling system, e.g. for rotating at least part of the modelling system relative to the mount and/or relative to the tripod, stand or other support.

The at least one processor may be configured to combine or composite together images and/or spatial data, e.g. to at least partly update the model. The images and/or spatial data that are combined or composited together may be collected during one or more, e.g. a plurality of, rotations and/or at one or more rotational positions of the modelling system. The processing system may be configured to composite together images and/or spatial data collected in the roaming mode with images and/or spatial data collected during one or more rotations or rotational positions of the modelling system, e.g. collected when the modelling system is in the mounted mode.

The modelling system may comprise one or more location, motion and/or orientation sensors, which may be configured to collect location, motion and/or orientation data of the modelling system. Examples of location, motion and/or orientation sensors include GPS sensors, accelerometers, level sensors, gyroscopes, inclinometers, tilt sensors, rotational sensors, angle encoders, and/or any other suitable location, motion and/or orientation sensors known in the art. The modelling system may be configured to at least partly determine which part of the model the image or spatial data is associated with or belongs to from the location, motion and/or orientation data associated with the respective images or spatial data or by a combination of matching the images and/or spatial data to the part of the model and the location, motion and/or orientation data associated with the respective images or spatial data.

The at least one processor of the modelling system may be configured to update the part of the model in real time or on the fly. The methods described above may allow the collected information to be quickly and straightforwardly stitched into the model in a manner that is efficient in processing resource and memory. This may make it easier for the model updating to be carried out in real time or on the fly.

According to a second aspect of the present disclosure is a modelling system comprising at least one imaging system, at least one depth information collection system, at least one processor and data storage. The modelling system may be configured to receive a part but not all of a model of a structure or environment from an external data store and store the part (but not all) of the model in the data storage of the modelling system. The modelling system may be configured to use the at least one imaging system to collect at least one image of a portion of the structure or environment associated with or represented by the part of the model comprised in the data storage. The modelling system may be configured to use the at least one depth information collection system to collect depth information of the part of the structure or environment associated with the part of the model comprised in the data storage. The modelling system may be configured to update the part of the model comprised in the data storage with the at least one image and the depth information to form an updated part of the model. The modelling system may be configured to transfer the updated part of the model back to the external data store.

The imaging system may comprise a digital camera. The depth information collection system may comprise a scanner, preferably a laser scanner but optionally could be an infra-red or other electromagnetic radiation based scanner, a magnetic, electrical or electromagnetic field scanner, a sonic or ultrasonic scanner and/or the like.

The external data store may be comprised in a server system, network attached storage (NAS) system and/or the like. The modelling system may be configured to connect to the external data store via a wired or wireless or optical cable connection.

The modelling system may be configured to implement the method of the first aspect.

The modelling system may comprise a communications system. The communications system may comprise a wired or wireless or optical fibre communications system, such as a usb, Ethernet or other wired communication system and/or a wi-fi, optical, Bluetooth, Zigbee, NF-IR, cellular communication (e.g. GSM, 3G, 4G, 5G or the like) or the like. The modelling system may be configured to determine, store and/or transfer changes (e.g. only changes) between the part of the model (e.g. as most recently received from the external data store) and the updated part of the model. The transfer of the changes may be from the data storage on the modelling device to the external data store.

The modelling system may be configured to match at least part of the depth information collected by the at least one depth information collection system and/or at least a portion of at least one of the images collected by the at least one imaging system to the model, e.g. by using pattern matching, key-point matching, pixel matching and/or the like. The modelling system may be configured to use the matched depth information and/or images to identify the location and/or orientation of the modelling system relative to the part of the structure, building, objects, surfaces or environment represented by the part of the model comprised in the data storage. The modelling system may be configured to use the relative position of matched and unmatched depth information and/or the relative arrangement of matched and unmatched images or portions of images in order to position the unmatched depth information and/or unmatched images or portions of images within the model.

The modelling system may be operable in a plurality of modes. The modelling system may be operable in mounted and/or roaming modes. In the mounted mode, the modelling system may be mounted on a tripod, stand or other mount. In the mounted mode, the modelling system may be configured to collect images and/or spatial data whilst at least one or all of the sensor systems are being rotated and/or between rotations of the at least one or all of the sensor systems, e.g. around a rotation axis, and/or at one or more different rotational positions around a rotation axis. In the roaming mode, the modelling system may be freely movable, de-mounted, hand held and/or detached from the stand, tripod or other support. The modelling system may be operable in a drone or vehicle mounted mode. In the drone or vehicle mounted mode, the modelling system may be mounted to a drone or other automated transport system or a vehicle.

The modelling system may be configured to stitch a plurality of the images and/or depth information together to form a unified image and/or unified depth information and/or at least a portion of the model, which may be used to update the part of the model stored in the data storage of the modelling system. The modelling system may be configured to stitch the images together at least in part by using the depth information, e.g. to guide the image stitching. For example the modelling system may be configured to use the depth information to determine if objects in a plurality of images are at the same or different spatial positions, or if objects shown in a plurality of images are the same or different objects, and stitch the images together accordingly.

In an optional arrangement, the modelling system may comprise a mount. The mount may be mountable or mounted to, or configured to receive, the stand, tripod or other support for supporting the modelling system. The mount may be or comprise a rotatable mount. The mount may be adapted to produce relative rotation of the mount and at least part or all of the rest of the modelling system, e.g. when in the rotating and/or mounted mode. The modelling system may be configured such that at least part of the modelling system (such as a part of the camera comprising at least one or each of the sensor systems) rotates or spins, for example relative to the mount and/or the tripod or stand or other support, e.g. when in the mounted or rotation mode. The modelling system may comprise a motor, such as a stepper motor, for rotating the modelling system, e.g. for rotating at least part of the modelling system relative to the mount and/or relative to the tripod, stand or other support. However, it will also be appreciated that at least part or all of the modelling system may alternatively or additionally be useable in a non-rotating mode, e.g. by using the multiple imaging systems to provide the required overall field of view.

The at least one processor may be configured to combine or composite together images and/or spatial data, e.g. to at least partly update the model. The images and/or spatial data that are combined or composited together may be collected during one or more, e.g. a plurality of, rotations and/or at one or more rotational positions of the modelling system. The processing system may be configured to composite together images and/or spatial data collected in the roaming mode with images and/or spatial data collected during one or more rotations or rotational positions of the modelling system, e.g. collected when the modelling system is in the mounted mode.

The modelling system may comprise one or more location, motion and/or orientation sensors, which may be configured to collect location, motion and/or orientation data of the modelling system. Examples of location, motion and/or orientation sensors include GPS sensors, accelerometers, level sensors, gyroscopes, inclinometers, tilt sensors, rotational sensors, angle encoders, and/or any other suitable location, motion and/or orientation sensors known in the art. The modelling system may be configured to at least partly determine which part of the model the image or spatial data is associated with or should be located from the location, motion and/or orientation data associated with the respective images or spatial data or by a combination of matching the images and/or spatial data to the part of the model and the location, motion and/or orientation data associated with the respective images or spatial data.

The at least one processor of the modelling system may be configured to update the part of the model in real time or on the fly.

According to a third aspect of the present disclosure is a processing system for modifying and/or creating at least part of a model, the processing system comprising at least one processor for modifying and/or creating at least part of the model and data storage for storing at least the part of the model and one or more images and spatial data of an environment to be imaged or modelled, and a communications or interface module for communicating some or all of at least part of the model, e.g. with an external data store.

The one or more images and spatial data may be collected using a method according to the first aspect and/or a modelling system according to the second aspect. The processing system may be configured to implement any of the features relating to a processing system described in relation to the first aspect. The processing system may be comprised in, be connected or be connectable to, or adapted to communicate with the modelling system of the second aspect. The processing system may be comprised in an assembly or system with the modelling system of the second aspect.

According to a fourth aspect of the present disclosure is a computer software product configured such that, when run on a suitable processing apparatus, causes the processing apparatus to implement the method of the first aspect of the present disclosure.

The computer program product may be embodied on a tangible, non-transitory computer readable medium.

According to a fifth aspect of the present disclosure is a modelling system comprising at least one imaging system, at least one depth information collection system, at least one processor and data storage, the modelling system being: operable in mounted and/or roaming modes; and/or configured to match at least part of the depth information collected by the at least one depth information collection system and/or at least part of one or more of the images collected by the at least one imaging system to the model; and/or configured to stitch a plurality of the images and/or depth information together to form a unified image and/or unified depth information and/or at least a portion of the model, which may be used to update the part of the model stored in the data storage of the modelling system.

In the mounted mode, the modelling system may be mounted on a tripod, stand or other mount. In the mounted and/or rotation mode, the modelling system may be configured to collect images and/or spatial data whilst at least one or all of the sensor systems are being rotated and/or between rotations of the at least one or all of the sensor systems, e.g. around a rotation axis, and/or at one or more different rotational positions around a rotation axis. In the roaming mode, the modelling system may be freely movable, demounted, hand held and/or detached from the stand, tripod or other support.

The matching may comprise pattern matching, pixel matching, keypoint matching and/or the like. The modelling system may be configured to use the matched depth information and/or images to identify the location of the modelling system relative to the part of the structure or environment associated with or represented by the part of the model comprised in the data storage. The modelling system may be configured to use the location of the modelling system relative to the part of the structure or environment associated with or represented by the part of the model comprised in the data storage and/or the relative position or arrangement of matched and unmatched depth information in order to position the unmatched parts of the depth information and/or the unmatched parts of the images in the model.

The modelling system may be configured to stitch the images together at least in part by using the depth information, e.g. to guide the image stitching. The modelling system may be configured to stitch the images together, e.g. based on image matching, pixel matching, keypoint matching and/or the like, and subsequently refine the stitching based on the depth information and/or wrapping the images around the depth information.

The modelling system of the fifth aspect may comprise one or more features described in relation to the first or second aspect individually or in combination, regardless of whether or not those features were described in combination with other features in the first or second aspect.

According to a sixth aspect of the present disclosure is a drone or vehicle comprising the modelling system of the second aspect or the fifth aspect. The drone may be a flying or other aerial drone. The vehicle may be a remotely operated or controlled vehicle or an autonomous, driverless or passenger-less vehicle.

It should be understood that the features defined above in accordance with any aspect of the present disclosure or below in relation to any specific embodiment of the disclosure may be utilised, either alone or in combination with any other defined feature, in any other aspect or embodiment of the disclosure. Furthermore, the present disclosure is intended to cover apparatus configured to perform any feature described herein in relation to a method and/or a method of using or producing or manufacturing any apparatus feature described herein.

BRIEF DESCRIPTION OF THE FIGURES

Various aspects of the invention will now be described by way of example only and with reference to the following drawings, of which.

DETAILED DESCRIPTION OF VARIOUS EMBODIMENTS

The present invention will now be described more fully hereinafter with reference to the accompanying drawings, in which some, but not all embodiments of the invention are shown. Indeed, the invention may be embodied in many different forms and should not be construed as limited to the embodiments set forth herein. Rather, these embodiments are provided so that this disclosure will satisfy applicable legal requirements. Like numbers refer to like elements throughout.

Figure 1:
FIG. 1 is a perspective view of a modelling system.
Figure 2:
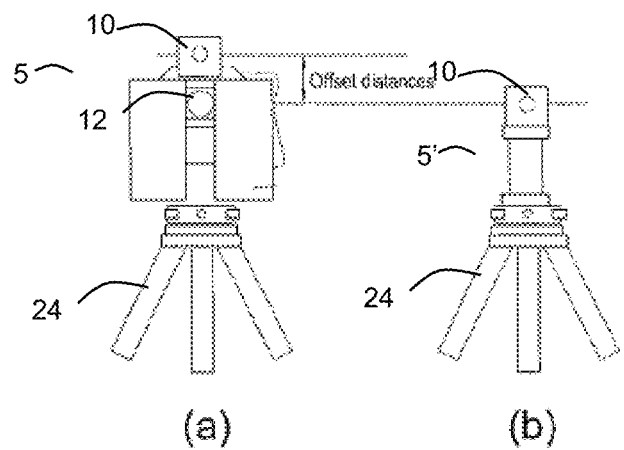
FIG. 2(a) is a side view of a modelling system.
FIG. 2(b) is a side view of an alternative modelling system.

FIG. 1 shows a modelling system 5' for collecting data for creating and/or modifying a virtual 3D model. The modelling system 5' comprises a panoramic camera 10' for collecting images of an environment around the modelling system and a laser scanner 12 for collecting depth information (i.e. depth information) of the environment around the modelling system.

In the example of FIG. 1, the camera 10' comprises a single imaging system 15 in the form of a digital camera that faces perpendicularly from a housing 20 that houses both the camera 10' and the laser scanner 12. The modelling system 5' is provided with a mount 22, for mounting to a stand, tripod or other support (not shown in FIG. 1). The housing 20 comprising both the camera 10' and the laser scanner 12 is rotatable on the mount 22, e.g. to rotate the camera 10' and laser scanner 12 around in a generally horizontal direction in use. The imaging system 15 of the camera 10' comprises a wide angle lens, such that rotating the camera 10' on the mount 22 through 360° allows images to be collected that cover the majority of an imaging sphere around the camera 10'. The laser scanner 12 can also rotate within the housing 20 around a rotational axis that is substantially perpendicular to the axis around which the housing 20 rotates on the mount 22. Again, a combination of rotation of the laser scanner 12 around both rotation axes allows the collection of the depth or range information covering the majority of the imaging sphere around the camera 10'.

Although an example is given above of a modelling system 5' that comprises an integrated camera 10' and laser scanner 12, wherein the camera 10' comprises a single horizontally facing imaging system 15, it will be appreciated that other camera 10/laser scanner 12 arrangements can be used. For example, the camera 10 and laser scanner 12 could be separate and optionally releasably fixable or mountable together. In certain embodiments, the camera 10 could have more than one imaging system 15, such as but not limited to two or preferably four imaging systems 15. For cameras 10 having more than one imaging system 15, each imaging system 15 is preferably oriented in a different direction, for example, each imaging system 15 being oriented to face in opposite directions in a two imaging system 15 camera 10 or each imaging system 15 being oriented so as to face perpendicularly to each neighbouring imaging system 15 in a four imaging system 15 camera 10. Furthermore, although at least some of the imaging systems 15 may be tilted to face generally upwardly or toward the zenith of the camera 10. As such, it will be appreciated that the number, orientation and/or tilt of the imaging systems 15 may vary from that shown in FIG. 1. Some non-limiting examples of possible arrangements of modelling system 5 and camera 10 that can be used with the present disclosure are described below in relation to FIGS. 2(a) to 5.

FIG. 2(a) shows an example of a modelling system 5 for collecting data for creating and/or modifying the virtual 3D model. The modelling system 5 comprises an alternative panoramic camera 10 for collecting images of an environment around the modelling system to that shown in FIG. 1. The modelling system 5 of FIG. 2(a) also comprises a laser scanner 12 for collecting the depth information (i.e. depth information) of the environment around the modelling system, as in the system of FIG. 1. In the example of FIG. 2(a) the camera 10 and the laser scanner 12 are separate components that a selectively mountable together. In this particular example, the laser scanner 12 mounts to the top of the camera 10, which is in turn rotatably mounted via a mount to a stand, tripod or other support 24.

In particular, the camera 10 of FIG. 2(a) is a panoramic camera configured to collect images covering a 360° overall field of view that subtends part of a sphere around the modelling system. In optional embodiments, the camera comprises a plurality of imaging systems 15, each being oriented in a different direction so that the combined fields of view of the plurality of imaging systems 15 cover the required overall field of view around the modelling system. In an alternative embodiment, the camera 10 comprises one or more imaging systems 15 that are rotatable in order to collect the images covering the required overall field of view around the modelling system.

The laser scanner 12 is directable and operable to also sweep over at least the required overall field of view around the modelling system in order to collect depth information. The depth information represents 3D locations of objects, surfaces and structures within the environment around the modelling system 5. In particular, the depth information collected by the laser scanner 12 represents distances between the modelling system 5 and a framework of lines or cloud of points on the objects, surfaces and structures within the environment around the modelling system 5. The laser scanner 12 operates by emitting a laser beam and collecting reflections of the laser beam from the objects, surfaces and structures within the environment around the modelling system 5. The orientation of the laser beam emitted from the laser scanner can be used to obtain angular information for the points on the objects, surfaces and structures and time of flight or other suitable analyses can be used to determine the distance between the modelling system 5 and the points on the objects, surfaces and structures. In this way, a 3D depth framework of the objects, surfaces and structures in the environment surrounding the modelling system 5 can be collected.

The camera 10 is mounted on top of the laser scanner 12. A camera processor (not shown) is connected to a processor in the laser scanner 12, typically via a USB port, so that images captured by the camera 10 can be automatically transferred to and stored in the scanner 12. The modelling system 5 comprising the combined camera 10/laser scanner 12 arrangement is configured so that when a laser scan is initiated, a signal is sent from the scanner processor via the USB port to cause the camera 10 to capture corresponding component images. The component images are transferred to the laser scanner 12 where they are stored in suitable data storage 70 (see FIG. 6) for later use. Once this is done, the laser is rotated and the laser scans (i.e. the depth information) are captured as normal.

To avoid the camera 10 imaging the laser scanner 12, the laser scanner 12 should ideally be 45 degrees or lower in the field of view 50 of the camera 10. To achieve this for a camera 10 that is 10 cm$^3$, the offset distance is 225 mm. If the camera 10 is 100 mm at its base, this blocks about 25 degrees (full angle) of the Zenith FOV of the laser scanner 12. Such a large offset distance is not desirable from a parallax point of view, but it allows the camera 10 to operate with all four imaging systems 15 at the same time. In the arrangement of FIG. 2(a), because the camera 10 is mounted at a different level to the laser scanner 12, it suffers from offset distance parallax. In this case, a software correction to account for the (known) separation between the camera and the scanner may be performed.

An alternative arrangement reduces or eliminates the offset parallax by providing a camera 10' that can be fitted on a bracket that is sized to exactly position the camera 10' in the same place as the laser scanner 12, is shown in FIG. 2(b). The bracket may be fixed using any suitable arrangement, for example the bracket may be threaded at one end, so that it can be screwed into position on the scanner mount.

In use, the laser scanner 12 in the arrangement of FIG. 2(b) is used to capture depth information (i.e. data that comprises distances between the laser scanner 2 and points or lines on objects or surfaces in the environment being imaged). It is then removed from its mount and the camera 10' on its bracket is put in place. A plurality of component images of the environment to be imaged are then captured using the camera 10'. An advantage of this arrangement is that the camera 10' can capture images of the scene at the same level as the laser scanner 12 and offset parallax errors are reduced. To accommodate different scanner heights, a range of brackets or mounts may be provided.

In embodiments, other spatial or distance determining sensors could be used instead of or in addition to the laser scanner 12 to collect depth information, such as infra-red sensors or sensors that use beams of other electromagnetic radiation, sonic sensors, magnetic or electrical field sensors, induction sensors, and/or the like. Furthermore, stereo photogrammetry based on at least partly overlapping images collected by different imaging systems 15 could be used to collect depth information in addition to or instead of the laser scanner 12 or other spatial or distance determining sensors.

Figure 3:
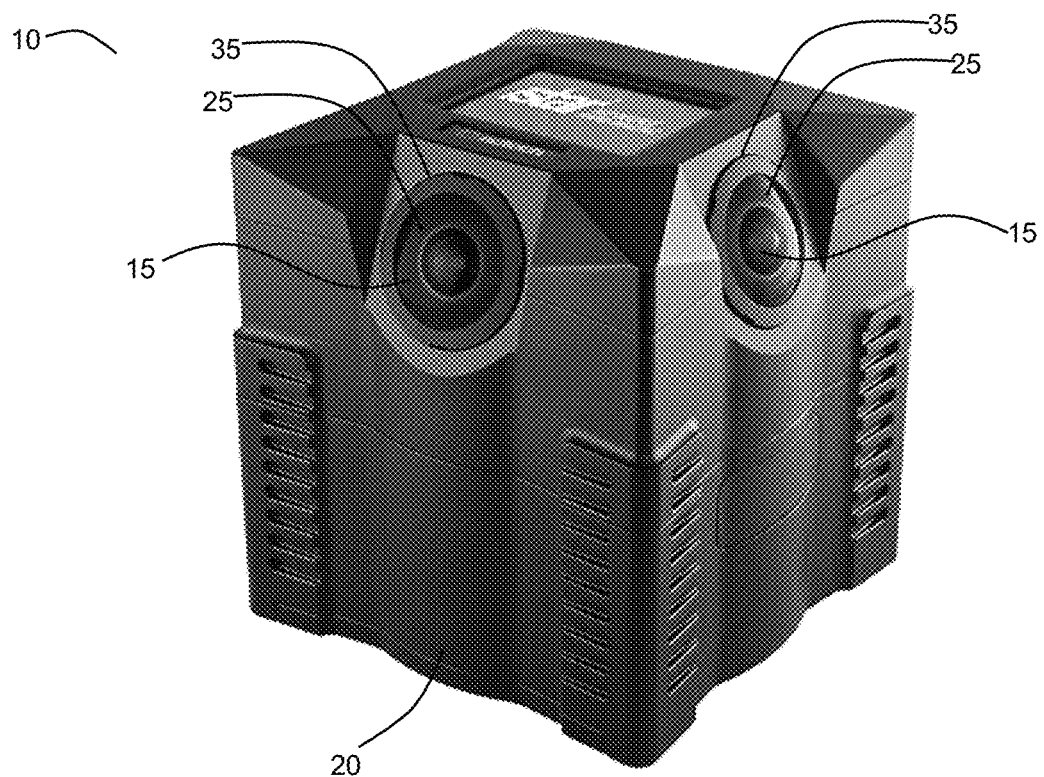
FIG. 3 is a perspective view of a camera that can be used in the system of FIGS. 2(a) and 2(b)
Figure 4:
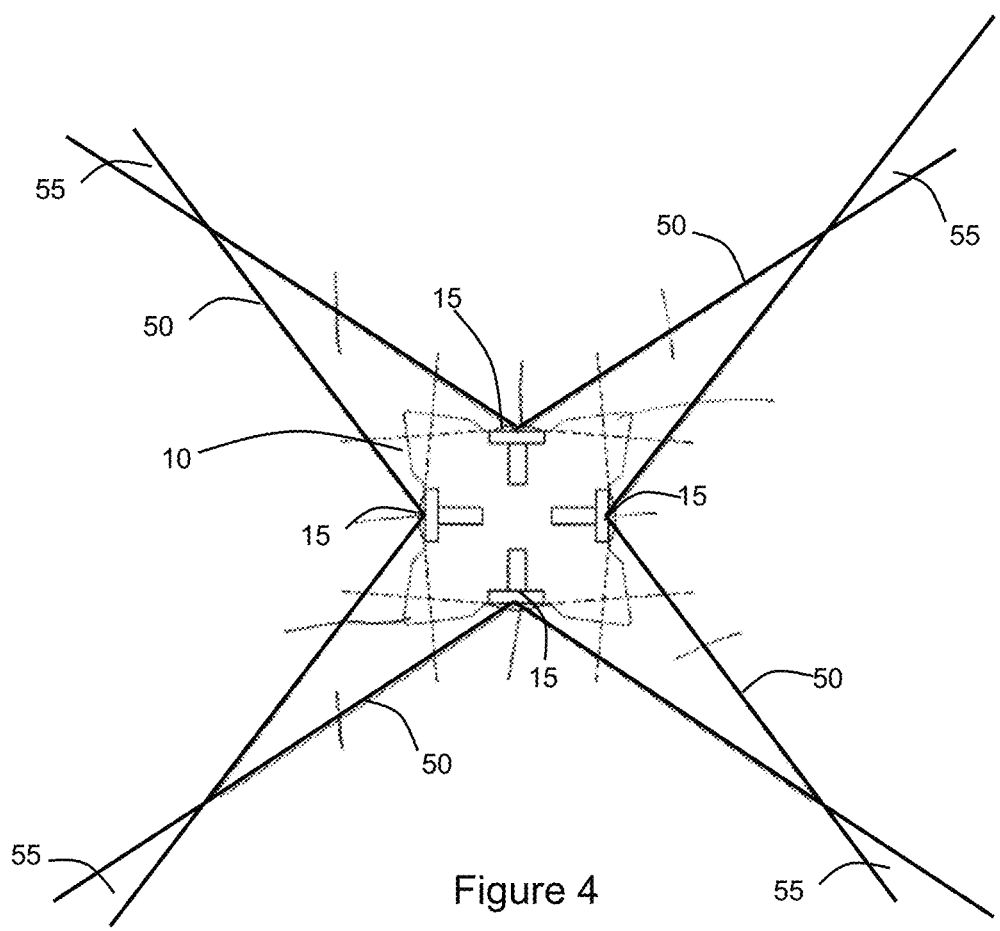
FIG. 4 is a planar view schematic showing the fields of view for each of the imaging systems of the camera of FIG. 3.
Figure 5:
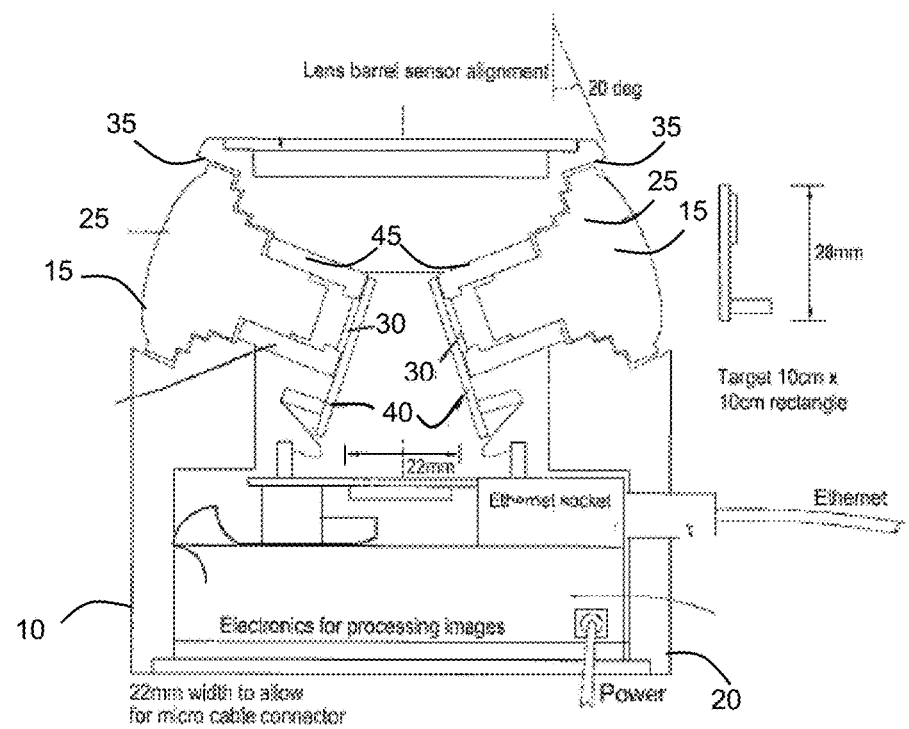
FIG. 5 is a vertical cross-sectional view of the camera of FIGS. 3 and 4.

FIGS. 3 to 5 show an example of the camera 10 in more detail. It will be appreciated that the camera 10 shown in FIGS. 3 to 5 is merely one example of a suitable panoramic camera that could be used and the disclosure is not limited to this specific example. The camera 10 of FIG. 2 has four imaging systems 15 (only two shown), each positioned on different external sides of a cube shaped housing 20. Each imaging system 15 comprises at least a wide angle lens 25 and a sensor 30 (see FIGS. 3 and 4) for sensing light from each of the lenses 25. Four is the optimum number of imaging systems 15 (no more or less, i.e. exactly four). In the particular example shown in FIGS. 3 to 5, each lens 25 is titled at an angle of around twenty degrees relative to the vertical, so that light above the camera 10 can be captured. Using four titled lenses 25 provides a 360×282.3 degree field of view without requiring any further imaging systems 15 to capture light above the camera 10. However, it will be appreciated that at least one or each of the lenses 25 need not be tilted and could instead face directly from the sides of the camera 10 (e.g. such that the imaging axes of the lenses 25 extend laterally or horizontally) or could be angled in any way that best suits the application for which the camera 10 is to be used.

Each sensor 30 is paired with one of the lenses 25 and is titled at the same angle and centred on the same optical axis as its paired lens 25. In the example shown in FIGS. 3 to 5, each lens 25 and its associated sensor 30 are tilted by twenty degrees. However, once again, it will be appreciated that one or more or each lens 25 and sensor 30 pair need not be tilted or could be tilted at any angle that best suits the desired field of view for the purpose for which the camera 10 is intended. In practice, the degree of tilt can be defined by the field of view of each lens 25 combined with how much of that view is captured on the sensor area. Sensor 30 and lens 25 pairs on opposite sides of the cube shaped housing 20 are symmetrically arranged in this example, though it will be appreciated that this need not necessarily be the case.

The camera 10 can be used to capture still or moving, i.e. video, images. The frame rate is defined by the capture rate of the sensors. Ideally, the frame rate would be more than ten frames per second for good resolution video.

The housing 20 is a one-piece housing 20 that has four external recesses 35, each shaped to receive and accurately locate field of view optics, typically the one or more lenses 25. As shown in FIG. 5, the housing 20 also provides a support 40 for the sensors 30. A sensor 30 is mounted on each side of the support 40. Optionally, a mounting barrel 45 is used to locate the lens 25 and sensor 30 relative to each other, thereby to form an integral unit, before insertion into the camera housing 20. This means that the lens 25 and sensor 30 positioning and alignment can be precisely defined prior to insertion into the camera 10, which greatly simplifies assembly. Using a single one-piece housing 20 allows accurate placement of the lenses 25 and sensors 30 in the XYZ planes within a confined space, thereby helping minimise parallax error. In particular, the housing 20 and support 40 hold the imaging systems 15 of the camera 10 at known and accurate relative positions and angles. In this way, geometrical properties of the camera 10 (such the separation and/or relative orientation of the imaging systems 15) are known with a high degree of accuracy.

The housing 20 holds the lenses 25 and all internal workings in place. The housing 20 may be made from any suitable material, for example solid aluminium. By way of an example only, the camera 10 is 10 $cm^3$ and the lens 25 is 5 cm×10 cm. However, it will be appreciated that different sizes and constructions of housing 20 and different lenses 25 and/or sensor 30 arrangements could be used, depending on the intended application or other factors. However, the single piece housing 20 in the present embodiment allows for heat dissipation and provides extremely robust and durable protection against bumps, drops, dust, water and many other harsh environmental in use factors.

By using the barrel 45, each lens 25 can be paired with a sensor 30 prior to insertion into the housing 20. This allows multiple lenses 25 and sensors 30 to be tested and calibrated as a single assembly calibration step to provide accurate live positioning verification prior to final bonding the assembly. This allows the calibration to be done externally of the camera 10, and fine tuning per lens 25 and sensor 30.

The camera 10 includes a configuration file for calibrating the camera 10 as a whole. This is determined using results from all four imaging systems 15. No camera 10 has the same configuration. The configuration file is stored in the camera and used to allow the camera 10 to manipulate image data very quickly. This enables extremely fast output of image data and live video feed.

The camera 10 has at least one tilt sensor (not shown) for sensing its tilt angle. For example, the camera 10 may include a tri-axis tilt sensor, such as an accelerometer, for example the LSM303DLM sensor from ST Microelectronics. This allows the tilt or orientation of the camera 10 relative to the horizontal to be determined. Also included in the camera 10 is image processing software for using the sensed tilt angle to correct image alignment, so that the image presented to the user on screen or saved in the memory is aligned to the horizontal regardless of the orientation of the camera 10.

The tilt information is used by the image processing software in the camera 10 to determine how to stitch the images from each of the lenses together, and how to present the image to the user keeping the horizon of the image relative to the user's view. Using tilt sensors allows the camera 10 to know which way up it is and its orientation. This information can be used by the image processing software to cancel out changes in the real orientation of the camera 10 from what the user wants to see. This allows a user to experience a stable and predictable view even when the camera 10 is moving in multiple axes.

Each of the wide angle lenses 25 has a usable field of view 50 in the range of 92 to 110 degrees. The fields of view 50 being over 90 degrees (e.g. between 92 and 110 degrees) is advantageous, and provides overlap regions 55 between the fields of view 22 of adjacent imaging systems 15 for stitching of the component images obtained from each imaging system 15, and in optional embodiments for collection depth information using stereo photogrammetry.

It will be appreciated that the camera 10 of FIGS. 3 to 5 is arranged to simultaneously collect a plurality of component images using the four imaging systems 15, each imaging system 15 being oriented at 90° to each of its neighbours. As such, the resulting component images collected by the camera 10 represent a field of view 50 from each side of the camera 10. The component images collected by adjacent imaging systems 15 comprise overlapping regions that represent parts of the environment being imaged in an area in which the fields of view of the neighbouring imaging systems 15 overlap (see FIG. 4).

In other words, each component image collected by each imaging system 15 has one or more (two, in the present example) overlap regions that image the same area as a corresponding overlap region in a component image taken by a neighbouring imaging system 15 of the camera 10.

Figure 6:
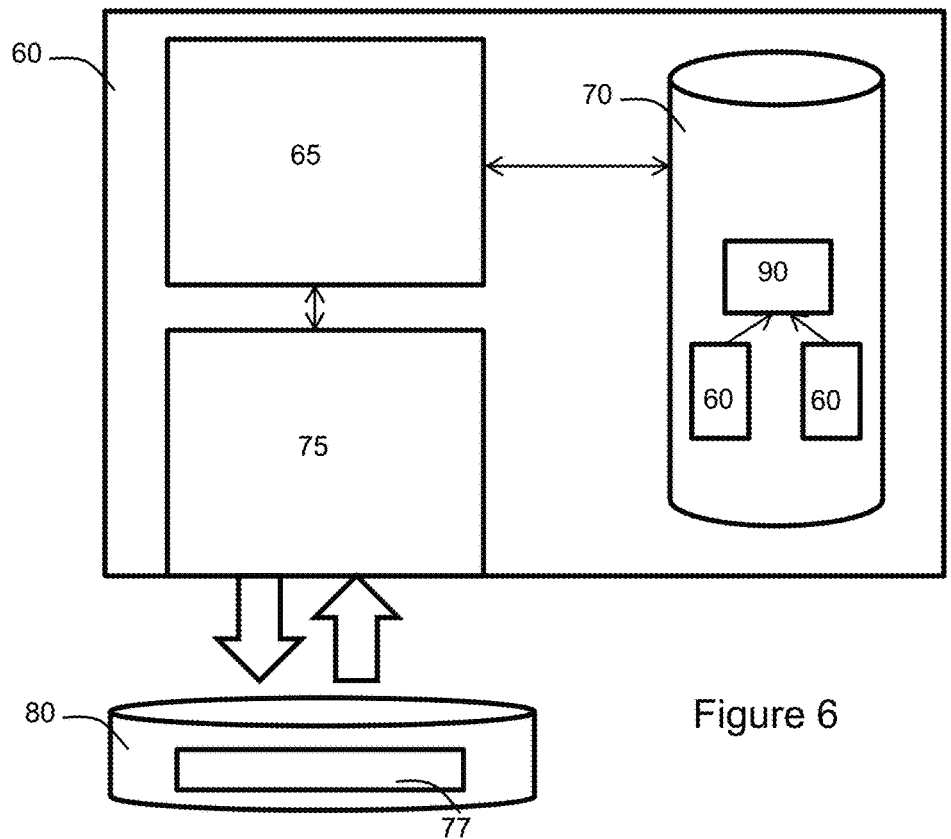
FIG. 6 is a schematic of a processing system for use in or with the modelling system of any of FIGS. 1, 2(a) and/or 2(b)

The modelling system 5, 5' comprises a processing system 60, as shown in FIG. 6, that is configured to store and update part of a virtual 3D model of the structure or environment to be modelled using the modelling system. The processing system 60 comprises a processor arrangement 65 in communication with data storage 70 and a communications system 75. The processor arrangement 65 may comprise one or more processors, e.g. including a central processing unit, one or more maths co-processors and/or one or more graphics co-processors. The data storage 70 may comprise any suitable data storage such as one or more magnetic storage devices (e.g. hard disk drives or the like), optical storage (such as cd or dvd disk storage or the like), solid state storage (such as flash memory, RAM, SSD or the like) and other suitable memory or data storage devices. The communications system 75 may comprise wired (e.g. Ethernet, USB, power line communication or the like) or wireless (e.g. wi-fi, Bluetooth, Zigbee, NFC, etc.) communications.

A method of operating the modelling system 5, 5' is described with reference to FIGS. 6 and 7. The virtual 3D model 77 of the environment or structure (e.g. a building) is stored in a data store 80 on a server 85 or other system. It is generally preferable to have the model 77 stored in a data store 80 on the central server system 85 so that it is accessible by various interested parties, such as customers, architects, site managers, project managers, contractors and/or the like.

Furthermore, the virtual 3D model 77 is generally very large and requires a huge amount of storage to store and bandwidth to communicate. Furthermore, performing processing operations on the model 77 can be highly processor intensive. In general, the modelling system 5 has to be portable in order to easily locate the modelling system 5 within the structure or environment to be modelled (e.g. the modelling system 5 must be moved from room to room within a building). This places certain restrictions on the size and weight of the modelling system 5 and therefore the amount of data storage and processor resource can be limited.

The server 85 or other system is configured to partition the model 77 into a plurality of parts 90 or store the model 77 as a plurality of parts 90, wherein at least some or all of each part 90 is exclusive, i.e. non-overlapping with the other parts 90. In step 600 in FIG. 7, when an operator intends to create or update the model 77, the operator downloads only the part or parts of the model 90 that are relevant to the part of the structure, building or environment that the operator is intending to model or update. In other words, the operator only downloads some but not all of the model 77, and has only the part(s) of the model 90 that the operator anticipates needing. The part of the model 90 is downloaded from the data store 80 on the server 85 onto the data storage 70 of the modelling system 5 using the communications system 75 (see FIG. 6). This can be carried out using a wired or wireless connection, although a wired or optical fibre connection may be preferred due to increased download rates The part of the model 90 is then stored in the data storage 70 on the modelling system 5.

Figure 7:
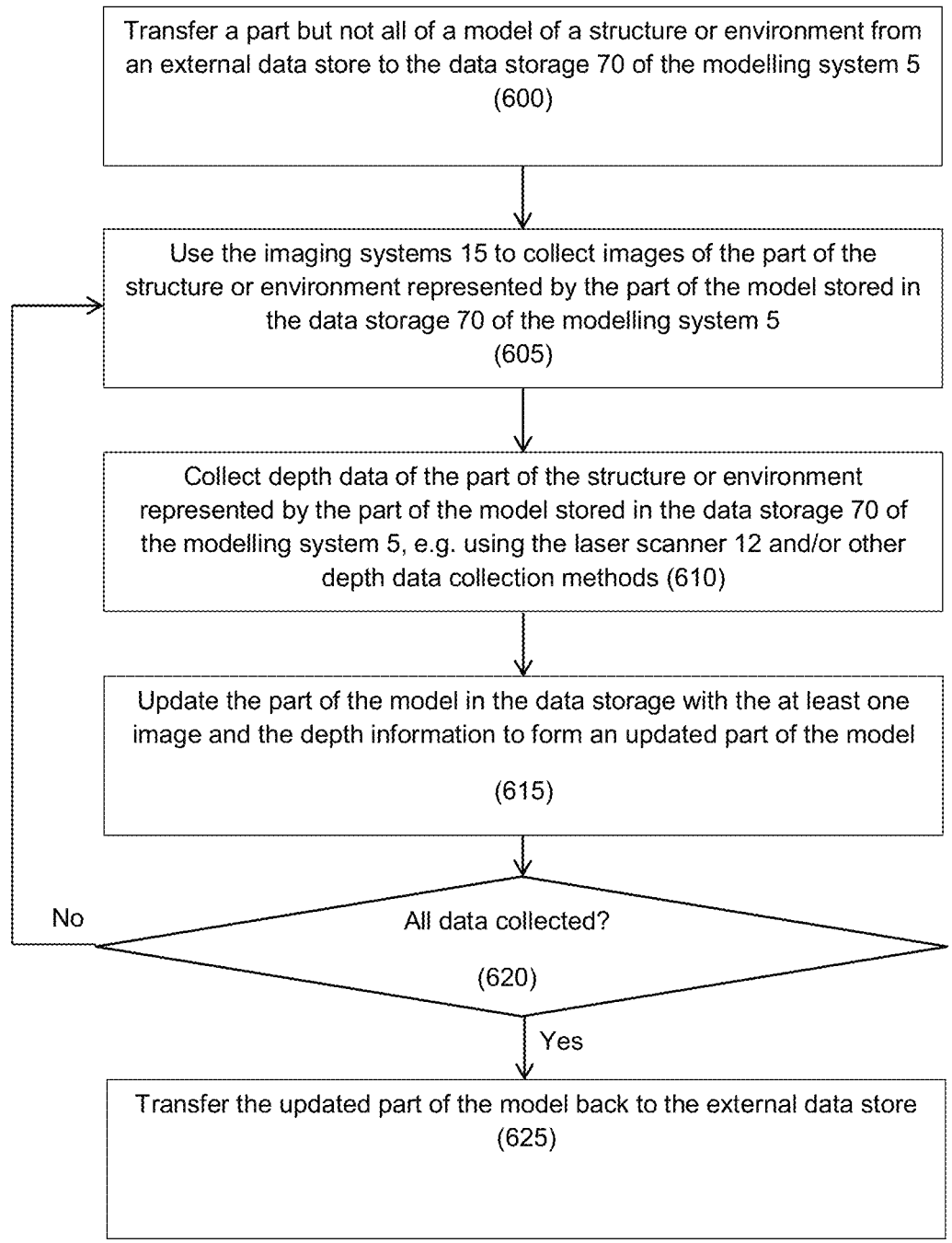
FIG. 7 is a flowchart of a method for updating a model, using a modelling system such as that of FIGS. 1, 2(a) and/or 2(b).

The modelling system 5 can then be taken to the area (e.g. an environment, building or other structure) to be modelled (i.e. an area associated with the part of the model 90 that was downloaded to the data storage 70 of the modelling system 5) and used to collect images 95 (step 605 in FIG. 7) and depth information 100 (step 610 in FIG. 7). This involves locating the modelling system 5 in the area and collecting images 95 from each of the four imaging systems 15 to achieve 360° imaging around the modelling system 5. Simultaneously or in succession the laser scanner 12 collects the depth information 100 in a 360° sweep around the modelling system 5.

The processing system 60 is operable to update the part of the model 90 stored in the data storage 70 using the collected images 95 and the depth information 100 (step 615). For example, the processing system 60 is operable to compare the images 95 and depth information 100 with the part of the model 90 stored in the data storage 70 and determine portions of the images 95 and depth information 100 that match the part of the model 90. These matching portions of the images 95 and depth information 100 are used by the processing system to identify the locations of the matching parts of the images 95 and the depth information 100 within the part of the model 90, which in turn can be used to determine the location and orientation of the modelling system 5 relative to the contents (e.g. objects, structures and/or surfaces) of the part of the model 90. The matching may involve key-point matching, pattern matching, object recognition and/or the like. Since the processing system 60 has access to images 95 and depth information 100 collected using the same modelling system 5 at the same location (i.e. the images 95 and depth information are inter-related), the processing system 60 is better able to match and stitch the images 95 and depth information 100 to the part of the model 90. In embodiments where the modelling system has position, orientation and/or motion sensors, such as GPS, triangulation systems, accelerometers, vibration sensors, tilt sensors, gyroscopic sensors and the like, the position, orientation and/or motion data collected by these sensors can be used instead of or preferably to supplement the matching process described above in order to determine the location and orientation of the modelling system 5 relative to the environment represented by the part of the model 90. The above matching/locating features also facilitate use of the modelling system in a hand-held or roaming mode.

The unmatched parts of the images 95 and depth information 100 that do not match the part of the model 90 stored in the data storage 70 correspond to parts of the objects, surfaces, and structures in the area being modelled that have changed since the part of the model 90 was generated or previously updated. The determined location and orientation of the modelling system 5 relative to the objects, surfaces, and structures in the part of the model 90 can be used to locate at least the unmatched parts of the images 95 and depth information 100 (or optionally all of the collected images 95 and depth information 100) in the model to replace the corresponding sections of the model in order to update the art of the model 90 stored in the data storage 70.

It will be appreciated that the update process described above in relation to steps 605 to 615 can be repeated (step 620) many times if so desired or necessary to update the required parts of the model 90. This may involve moving the modelling system 5 to a different location before repeating the process or may even involve detaching the modelling system 5 from the tripod or stand 24 and using it to collect images and/or depth information whilst in a hand held roaming mode. It will be appreciated that this could be used to collect image and/or depth information from areas that are obscured behind blocking objects and the like in order to more fully construct or update the part of the model 90. As such, a combination of image and depth information collection from the modelling system 5 in both a mounted mode when it is mounted on the stand or tripod 24 and a roaming mode when it is detached from the stand or tripod 24 (e.g. hand held) can be particularly beneficial.

After the desired model updating has been completed, the updated part of the model 90 is transferred from the data storage 70 of the modelling system 5 back to the data store 80 on the server system 85 using the communications system 75 (e.g. by wired, wireless or optical cable connection). The server system 85 then replaces the corresponding previous part of the model 90 with the updated part of the model 90 to produce an updated overall model 77. The updated overall model 77 can then be viewed by interested parties, e.g. to check on the progress of a building or the like, for example to see if the building is progressing at the desired rate or that the construction is as intended or simply to keep informed of progress or help visualise what the completed building will be like.

The modelling system 5 and method described above in relation to the drawings describe exemplary implementations of the present disclosure. However, it will be appreciated that the disclosure is not limited to these specific examples and that further implementations that fall within the scope of the claims would be apparent to a skilled person.

For example, whilst the modelling system 5 is described above as having a camera 10 having four imaging systems 15 configured to collect images over 360° around the camera 10 without having to move or rotate the camera 10, it will be appreciated that the camera may instead optionally comprise fewer or more imaging systems, e.g. one or more imaging systems and optionally could be configured to rotate or otherwise sweep the imaging systems in order to collect images over a desired total or aggregate field of view. Furthermore, whilst the imaging systems 15 may be tilted upwards or towards the azimuth, it will be appreciated that some or all of the imaging systems 15 may be untilted or laterally facing or may be tilted at other angles.

Furthermore, whilst use of a laser scanner 12 to collect at least some of the depth information 100 is described above, it will be appreciated that it is possible to use other means to collect at least some of the depth information instead of or in addition to the laser scanner 12. For example, at least partly overlapping images 95 collected by differently located imaging systems 15 could be used to determine depth information by stereo-photogrammetric methods. Other examples of means for collecting depth information include an infra-red or other electromagnetic radiation based scanner, an ultrasound scanner, a magnetic, electrical or electromagnetic field scanner and/or the like. The non-laser based means for collecting depth information may be preferable for modelling systems that are configured for use in hand held or roaming mode.

Of course, many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A method for generating or updating a virtual 3D model of a structure or environment, the method comprising:
   using a modelling system comprising:
   a panoramic camera configured to collect images covering a 360° overall field of view that subtends part of a sphere around the modelling system,
   at least one processor, and
   data storage,
   wherein the panoramic camera comprises
   a plurality of imaging systems arranged such that the plurality of imaging systems together collect images covering the field of view without rotating the camera; and
   the method further comprising:
   transferring a part but not all of a three-dimensional (3D) model of a structure or environment from an external data store to the data storage of the modelling system;
   using the at least one imaging system to collect at least one image of the structure or environment;
   determining or collecting depth information for the structure or environment; and
   updating the part of the 3D model in the data storage of the modelling system with the at least one image and the depth information to form an updated part of the 3D model.

2. The method of claim 1, comprising transferring the updated part of the 3D model from the data storage of the modelling system to the external data store and modifying the 3D model stored by the external data store with the updated part of the 3D model received from the data storage of the modelling system.

3. The method of claim 2, wherein modifying the 3D model stored by the external data store comprises replacing only those portions of the 3D model stored in the external data store that have changed with the corresponding portions of the updated 3D model.

4. The method of claim 1, wherein the depth information is representative of 3D positions of objects, structures or surfaces in the environment around the modelling system or distances from the modelling system to objects, structures or surfaces in the environment around the modelling system.

5. The method of claim 1, wherein the depth information is collected by a depth information collection system of the modelling system, the depth information collection system comprising a laser scanner, an infra-red or other electromagnetic radiation based scanner, or a magnetic, electrical or electromagnetic field scanner.

6. The method according to claim 1, wherein the method comprises deriving at least part or all of the depth information from stereo-photogrammetry from a plurality of at least partially overlapping images collected by the at least one imaging system.

7. The method according to claim 1, wherein the external data store is comprised in a server system, network attached storage (NAS) system, or a personal or enterprise level computer.

8. The method according to claim 1, wherein the modelling system is configured to connect to the external data store via a wired or wireless connection.

9. The method according to claim 1, further comprising matching at least part of the depth information or at least part of one or more of the images collected by the at least one imaging system to a corresponding portion of the 3D model.

10. The method according to claim 9, further comprising using the matched depth information or images to identify the location of the modelling system relative to the part of the structure or environment associated with or represented by the part of the 3D model comprised in the data storage.

11. The method of claim 9, further comprising using the location of the modelling system relative to the part of the structure or environment associated with or represented by the part of the 3D model comprised in the data storage or a relative position or arrangement of matched and unmatched depth information in order to position the unmatched parts of the depth information or the unmatched parts of the images in the 3D model.

12. The method of claim 1, further comprising operating the modelling system in a plurality of modes, comprising at least mounted and roaming modes, wherein:
    in the mounted mode, the modelling system is mounted on a tripod, stand or other mount; and
    in the roaming mode, the modelling system is freely movable, de-mounted, hand-held or detached from the stand, tripod or other support.

13. The method of claim 1, comprising stitching a plurality of the images or depth information together to form a unified image or unified depth information or at least a portion of the 3D model, and updating the part of the 3D model stored in the data storage of the modelling system with the unified image, unified depth information or portion of the 3D model.

14. The method of claim 13, comprising stitching the images together at least in part using the depth information to guide the image stitching.

15. The method of claim 14 comprising using the depth information to determine if objects in a plurality of images are at the same or different spatial positions, or if objects shown in a plurality of images are the same or different objects, and stitching the images together accordingly.

16. The method of claim 15, wherein:
    the modelling system comprises one or more location, motion or orientation sensors configured to collect location, motion or orientation data of the modelling system, and
    the method comprises at least partly determining which part of the 3D model the image or spatial data is associated with or belongs to the location, motion or orientation data associated with the respective images or spatial data or by a combination of matching the images or spatial data to the part of the 3D model and the location, motion or orientation data associated with the respective images or spatial data.

17. The method according to claim 1, comprising updating the part of the 3D model in real time or on the fly.

18. A modelling system comprising:
    a panoramic camera configured to collect images covering a 360° overall field of view that subtends part of a sphere around the modelling system,
    a depth information collection system,
    at least one processor, and
    data storage,
    wherein:
        the panoramic camera comprises
            a plurality of imaging systems arranged such that the plurality of imaging systems together collect images covering the field of view without rotating the camera; and
        the modelling system is configured to:
            receive a part but not all of a 3D model of a structure or environment from an external data store and store the part but not all of the 3D model in the data storage of the modelling system;
            use the at least one imaging system to collect at least one image of a portion of the structure or environment associated with or represented by the part of the 3D model comprised in the data storage of the modelling system;
            determine or collect depth information for the part of the structure or environment associated with the part of the 3D model comprised in the data storage of the modelling system using the depth information collection system; and
            update the part of the 3D model comprised in the data storage of the modelling system with the at least one image and the depth information to form an updated part of the 3D model.

19. A system comprising a processing system and a modelling system, the modelling system comprising:
    a panoramic camera configured to collect images covering a 360° overall field of view that subtends part of a sphere around the modelling system,
    a depth information collection system, and
    data storage,
    wherein:
        the panoramic camera comprises
            a plurality of imaging systems arranged such that the plurality of imaging systems together collect images covering the field of view without rotating the camera; and
        the modelling system is configured to:
            receive a part but not all of a 3D model of a structure or environment from an external data store and store the part but not all of the 3D model in the data storage of the modelling system;
            use the at least one imaging system to collect at least one image of a portion of the structure or environment associated with or represented by the part of the 3D model comprised in the data storage of the modelling system;
            determine or collect depth information for the part of the structure or environment associated with the part of the 3D model comprised in the data storage of the modelling system using the depth information collection system; and
            update the part of the 3D model comprised in the data storage of the modelling system with the at least one image and the depth information to form an updated part of the 3D model; and the processing system comprising:
- at least one processor for modifying or creating at least part of the 3D model using one or more images and spatial data of an environment to be imaged or modelled, the one or more images and spatial data having been collected or determined by the modelling system; and
- a communications or interface module for communicating some or all of at least part of the 3D model with an external data store.

20. A computer software product embodied on a tangible, non-transitory computer readable medium configured such that, when run on a suitable processing apparatus, the computer software product causes the processing apparatus to implement the method of claim 1.

21. A vehicle comprising the system of claim 19.

22. The vehicle of claim 21, wherein the vehicle is a drone.

* * * * *